United States Patent
Srinivasan (10) Patent No.: US 7,979,831 B1
(45) Date of Patent: Jul. 12, 2011

(54) PLACEMENT DRIVEN CONTROL SET RESYNTHESIS

(75) Inventor: Sankaranarayanan Srinivasan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 432 days.

(21) Appl. No.: 12/272,496

(22) Filed: Nov. 17, 2008

(51) Int. Cl.
*G06F 17/50* (2006.01)

(52) U.S. Cl. ........ 716/122; 716/104; 716/116; 716/118; 716/119; 716/121; 716/123; 716/139

(58) Field of Classification Search .................. 716/104, 716/116, 118–119, 121–123, 139
See application file for complete search history.

(56) References Cited

U.S. PATENT DOCUMENTS 5,619,419 A * 4/1997 D'Haeseleer et al. ........ 716/123
6,792,585 B1 * 9/2004 Ku et al. ........................ 716/122

OTHER PUBLICATIONS

U.S. Appl. No. 12/429,842, filed Apr. 24, 2009, Srinivasan et al.
U.S. Appl. No. 12/429,991, filed Apr. 24, 2009, Fang et al.

* cited by examiner

*Primary Examiner* — Nghia M Doan
(74) *Attorney, Agent, or Firm* — W. Eric Webostad; Thomas George (57) ABSTRACT

Circuit placement for increasing circuit packing density for an integrated circuit is described. A design is synthesized and mapped. Components of the design are placed to provide a first placed design. A congestion density map is generated for the first placed design. A congestion region in the congestion density map is identified and targeted for determining if the first placed design has a control set conflict. A first circuit object associated with the control set conflict is selected and either re-placed or re-synthesized to at least diminish the control set conflict.

18 Claims, 9 Drawing Sheets

```
Main()    901
{
        RunGlobalPlacement();    902
        DivideDeviceIntoBins ();    903

CreateCongestionMap ();    904

DetermineFlopsForResynthesis(vector<Flop>);    905

ResynthesizeFlops (vector<Flop>);    906

RunFullPlacement();    907
}
```

PLACEMENT DRIVEN CONTROL SET RESYNTHESIS

FIELD OF THE INVENTION

The invention relates to integrated circuit devices ("ICs"). More particularly, the invention relates to placement driven control set resynthesis for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

It should be understood that a "global placement" places components in a netlist without assigning circuit resources. An initial global placement may not result in a "legal" or "valid" placement, as the demand for resources in a region may exceed the supply of such resources in such region, namely an overlap. Conventionally, an "analytical placement" was used to optimize wirelength and spread resources to reduce such overlap. Thus, a design may be iteratively globally and analytically placed to obtain a "legal" design. The process of obtaining a design without overlap is sometimes referred to as "legalization." A "detailed placement" or "full placement" assigns each component in the netlist to specific resources for an implementation and may try to improve a cost function. A "detailed placement" or "full placement" may start with a legalized placement. However, more commonly, a detailed placement includes a legalizer, and thus a detailed placement may take a result from a global placement having overlaps and produce an optimized overlap-free result. The terms "global placement," "analytical placement," and "detailed" or "full placement" are known in the art.

When placing components of a circuit design for generating a netlist to be used to instantiate a design in an FPGA, it is possible that certain components will be placed in a same localized region of FPGA fabric. Thus more than one component may be placed in a same localized region. However, the control sets for components placed in a same localized region in some instances are different. Heretofore, components placed in a same localized region, such as a slice in FPGA fabric, had to have the same control set, and thus components in a same localized region with conflicting control sets had to be re-placed to resolve the conflict. It should be understood that when there is a relatively high amount of control set contention, producing a valid or "legal" solution using conventional means may involve deviating too much from the original solution obtained from a global placement. Such a deviation may have negative impact on various metrics, such as for example timing, power, and wirelength, among others, that were attempted to be optimized as part of a global placement.

Accordingly, it would be desirable and useful to provide means to resolve such limitation without having to re-place a component with a conflicting control set in order to increase packing density.

SUMMARY OF THE INVENTION

One or more aspects generally relate to placement driven control set resynthesis for an integrated circuit.

An aspect relates generally to a method for circuit placement. A design is synthesized and mapped. Components of the design are placed to provide a first placed design. A congestion density map is generated for the first placed design. A congestion region in the congestion density map is identified and targeted for determining if the first placed design has a control set conflict. A first circuit object associated with the control set conflict is selected and either re-placed or re-synthesized to at least diminish the control set conflict.

Another aspect relates generally to a method for increasing circuit packing density. A control set hierarchy for a synthesized and placed design is generated. An analytical placement of the design is executed. Control set conflicts are identified from congestion information obtained from the analytical placement of the design. Each number of look-up table pins to be available for incremental resynthesis of the design to resolve the control set conflicts is determined. It is then determined whether driver look-up tables associated with the control set conflicts each have the number of look-up table pins available for the incremental resynthesis respectively associated therewith, and which of the control set conflicts have partial set unions with respect to associated control sets thereof capable of being resolved by the incremental resynthesis. The incremental resynthesis includes moving functionality of a first circuit object having a control set conflict to a driver look-up table of the driver look-up tables associated therewith. The first circuit object has the control set conflict with a second circuit object. The control set conflicts capable of being resolved by the incremental resynthesis and having the number of look-up table pins available for the incremental resynthesis respectively associated therewith are incrementally re-synthesized.

Yet another aspect relates generally to a method for increasing circuit packing density. A first analytical placement is performed. A first congestion area from the first analytical placement is identified. It is determined if a first control set overlap exists in the first congestion area, and if so, then a first circuit associated with the first control set overlap is collected for resynthesis. The resynthesis of a first control set of the first circuit is performed. A second analytical placement is performed after the resynthesis.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Reference will now be made in detail to embodiments, examples of which are illustrated in the accompanying drawings. In the following detailed description, numerous specific details are set forth in order to provide a thorough understanding of the invention. It should be apparent, however, to one skilled in the art, that the invention may be practiced without all the specific details given below. Moreover, the embodiments are not intended to be exhaustive or to limit the invention to the precise forms disclosed, and modifications and variations are possible in light of the following teachings or may be acquired from practice of the invention. The embodiments were chosen and described in order to best explain principles of the invention and practical applications thereof to enable others skilled in the art to utilize the invention in various embodiments and with various modifications as are suited to the particular use contemplated. In other instances, well-known methods, procedures, components, circuits, and networks have not been described in detail so as not to unnecessarily obscure the embodiments.

For purposes of explanation, specific nomenclature is set forth to provide a thorough understanding of the various inventive concepts disclosed herein. However, the terminology used herein is for the purpose of describing particular embodiments only and is not intended to be unnecessarily limiting of the invention. As used herein, the singular forms "a", "an," and "the" are intended to include the plural forms as well, unless the context clearly indicates otherwise. As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. It will also be understood that the term "and/or" as used herein refers to and encompasses any and all possible combinations of one or more of the associated listed items. It will be further understood that the terms "include," "includes," and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

Some portions of the detailed descriptions that follow may be presented in terms of algorithms and symbolic representations of operations on data bits within a computer memory. Such algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those involving physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it should be appreciated that throughout the description, discussions utilizing terms such as "processing" or "computing" or "calculating" or "determining" or "displaying" or the like, refer to the action and processes of a computer system, or similar electronic computing device, that manipulates and/or transforms data represented as physical (electronic) quantities within the computer system's registers and memories into other data similarly represented as physical quantities within the computer system memories or registers or other such information storage, transmission, or display devices.

Inventive concepts described herein may be embodied as apparatus, method, system, or computer program product. Accordingly, one or more of such embodiments may take the form of an entirely hardware embodiment, an entirely software embodiment (including firmware, resident software, and micro-code, among others), or an embodiment combining software and hardware, and for the sake of clarity any and all of these embodiments may generally be referred to herein as a "circuit," "module," "system," or other suitable term(s). Furthermore, such embodiments may be of the form of a computer program product on a computer-usable storage medium having computer-usable program code in the medium.

Any suitable computer-usable or computer-readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium include the following: an electrical connection having one or more wires; a portable computer diskette; a hard disk; a random access memory (RAM); a read-only memory (ROM); an erasable programmable read-only memory (EPROM or Flash memory); an optical fiber; a portable compact disc read-only memory (CD-ROM); an optical storage device; a transmission media such as those supporting the Internet or an intranet; or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to the Internet, wireline, optical fiber cable, radio frequency (RF), or other means.

Computer program code for carrying out operations in accordance with inventive concepts described herein may be written in an object-oriented programming language such as Java, Smalltalk, C++, or the like. However, the computer program code for carrying out such operations may be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a network, such as for example a local area network (LAN) or a wide area network (WAN), or the connection may be made to an external computer (for example, through the Internet using an Internet Service Provider).

Systems and methods described herein may relate to an apparatus for performing the operations associated therewith. This apparatus may be specially constructed for the required purposes, or it may comprise a general-purpose computer selectively activated or reconfigured by a computer program stored in the computer.

Notwithstanding the foregoing, the algorithms and displays presented herein may not be inherently related to any particular computer or other apparatus. Various general-purpose systems may be used with programs in accordance with the teachings herein, or it may prove convenient to construct a more specialized apparatus to perform the operations. In addition, even if the following description is with reference to a programming language, it should be appreciated that any of a variety of programming languages may be used to implement the teachings as described herein.

The embodiments may be described below with reference to flowchart illustrations and/or block diagrams of methods, apparatuses (including systems), and/or computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the Figures illustrate the architecture, functionality, and operation of possible implementations of apparatuses (including systems), methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

It should be noted that although the flow charts such as may be provided herein show a specific order of method steps, it is understood that the order of these steps may differ from what is depicted. Also, two or more steps may be performed concurrently or with partial concurrence. Such variation will depend on the software and hardware systems chosen and on designer choice. It is understood that all such variations are within the scope of the invention. Likewise, software and web implementations of the present invention could be accomplished with standard programming techniques with rule based logic and other logic to accomplish the various database searching steps, correlation steps, comparison steps and decision steps. It should also be noted that the word "component" as used herein and in the claims is intended to encompass implementations using one or more lines of software code, and/or hardware implementations, and/or equipment for receiving manual inputs.

Figure 1:
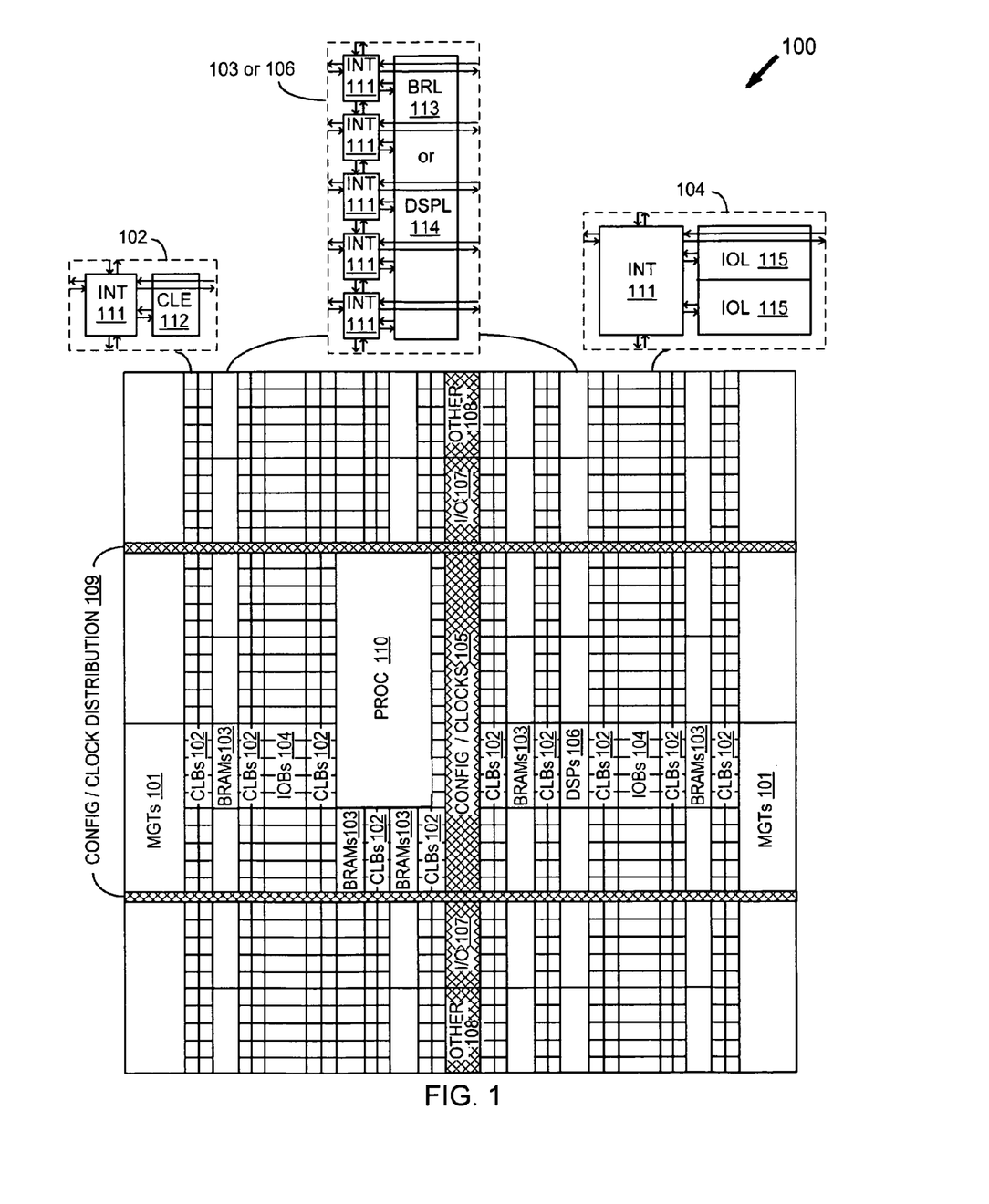
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
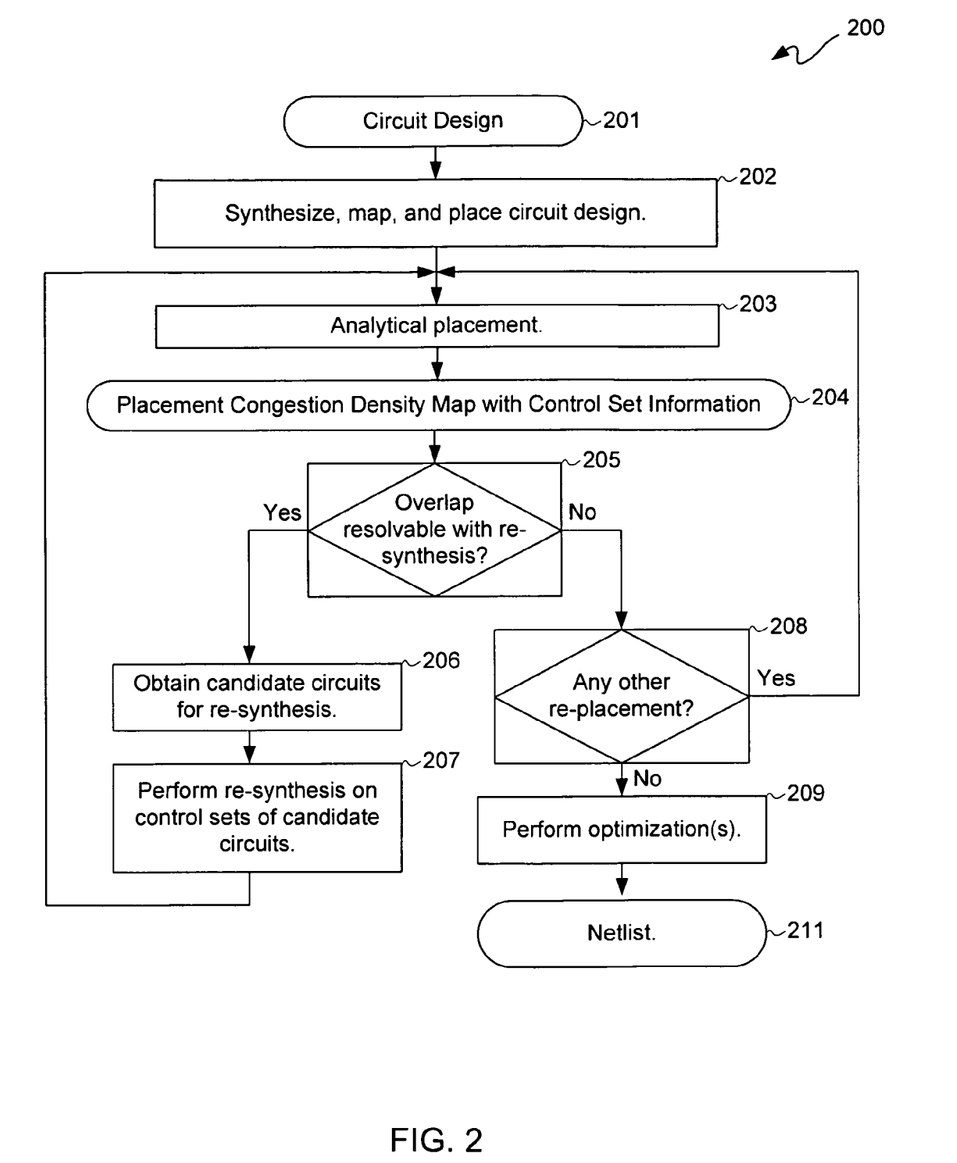
FIG. 2 is a flow diagram depicting an exemplary embodiment of a circuit placement flow.

FIG. 2 is a flow diagram depicting an exemplary embodiment of a circuit placement flow 200. A circuit design 201 is provided for synthesizing, mapping, and placing at 202. Placement at 202 is a conventional placement, and may be performed by what is commonly referred to as a global placement engine. As operations performed at 202, including software implementations for such operations are well known, they are not described in unnecessary detail herein.

Global placement at 202 may result in placement overlap. During global placement, a design may not be completely fitted, and some cells or sites may have overlaps, namely multiple components on a same localized region or site, namely a same defined block of circuitry. For purposes of clarity by way of example and not limitation, a site shall be considered a slice, such as an FPGA slice. An FPGA CLB, such as CLBs 102 of FIG. 1, may include one or more slices. With reference to a Virtex5 FPGA from Xilinx, a CLB has two slices, and each slice has 4 LUTs, 4 registers, and other "basic elements" ("BELs"). Placement overlap may be recorded by a data structure called a density map.

During global placement at 202, a device grid, where such device for example is for an FPGA, is divided into bins. A bin may be a "leaf level slot" on such a device, such as a "basic element" ("BEL") level, a slice level, a tile level, or multiple tile levels, based on bin size. Thus, each bin has a capacity. For purposes of clarity by way of example and not limitation, it shall be assumed that a bin is a slice. Thus if demand for bins exceeds the supply of bins, there is a state of overlap.

For a slice, there may be a condition that all components placed in a same slice have a same control set. By control set it is generally meant a set of one or more signals used to control a circuit component or circuit element, such as a sequential element. For purposes of clarity by way of example and not limitation, flip-flops are described, however it should be appreciated that look-up table ("LUT") memories of FPGAs also have control sets and are applicable to the following description. Furthermore, other circuit elements having one or more control signals provided thereto may be used. Each combination, of which there may be multiple possible combinations, of control signals for controlling a sequential element it is termed a control set for such sequential element.

As previously described, a slice may be a bin granularity, as slice packing has a control set restriction. Alternatively, a bin may be at a granularity other than a slice if it has a control set limitation. Furthermore, bins may be hierarchical.

Overlap in a bin may be calculated based on the number of objects occupying the bin and the number of slots available to place such objects in. Output from operations at 202, which may be an interim netlist, is provided for analytical placement at 203. At 203, analytical placement is performed to generate one or more density maps, where such density maps indicate overlap. Areas of overlap in a density map may be identified as congestion regions, namely the density map is a congestion density map where hotspots or areas of greatest component density may be identified. As part of analytical placement at 203, sequential elements such as flip-flops in one or more congested regions may be evaluated with respect to their respective control sets.

For each bin, the number of different control sets, namely sequential elements with different control sets in such bin, may be determined. If a bin, such as a slice, is limited to a single control set for all sequential elements, then if sequential elements in a bin have two or more different control sets, there is what is known as a control set overlap or conflict.

Accordingly, output of analytical placement 203 may be a placement congestion map with control set information 204. From map 204, it may determined at 205 if there is any control set overlap capable of being resolve by incremental resynthesis. If there is one or more control set overlaps capable of being resolved by incremental resynthesis, then candidate circuits for resynthesis may be obtained at 206. More particularly, all candidate circuits, namely a subset of sequential circuits associated with a control set overlap, for incremental resynthesis may be obtained at 206. A candidate circuit is a circuit that has a control set that is different from the control set of another circuit in the same bin. For example, if two registers are placed in the same slice, and such registers have different control sets, then one of those registers may be selected as a candidate circuit for resynthesis. For example if a register is implemented as a flip-flop, then such flip-flop may be a candidate for resynthesis. Moreover, if there are more than two sequential elements in a same bin, where no two of such sequential elements have the same control set, then more than one candidate circuit for resynthesis may be obtained from the same bin.

At 207, candidates obtained or otherwise selected at 206 may be re-synthesized. It should be understood that in the placement stage the candidate circuits are actually circuit objects. Furthermore, it should be understood that a bin is a bin or block object having available slots for placing circuit objects. At this point in time, such circuits are actually virtual circuits, and such bins are virtual circuitry in which such circuits may be instantiated by programming field programmable logic gates of a field programmable array of such logic gates. An example of a bin, is a slice or virtual slice. In other words, actual implementation of a design follows after virtual synthesis. Thus, even though reference to circuits has been made for purposes of clarity, it should be understood that textual or graphic representations of circuits are actually being manipulated.

It should be appreciated that resynthesis at 207 is a control set resynthesis, which is described below in additional detail. By control set resynthesis, it is generally meant that at least one control signal from a sequential element, such as a flip-flop, is moved into logic driving the sequential element. In the context of an FPGA slice, the logic driving the sequential element is a look-up table ("LUT"). Thus, for the exemplary embodiment described below, the control signal or more particularly, the circuitry for which receipt of the control signal causes a function to be performed, is moved from the sequential element to the driving component such that control sets for sequential elements within the same bin are the same. In other words, a different or new control set is created for a sequential element such that the new control set matches the control set of another sequential element within the same bin.

With respect to the FPGA slice embodiment, sync control signals may be moved to a LUT. Examples of sync signals for a flip-flop are clock enable, set, reset, and clear. The actual clock signaling provided to a flip-flop may not be moved to a LUT for purposes of harmonizing differing clock signals in control sets in a same bin. Additionally, it should be understood that set and reset may be either synchronous or asynchronous signals; however, resynthesis of set/reset is only for synchronous instances of those signals. As described below, in additional detail, during resynthesis of a control set of a flip-flop, a control signal is moved to a driving LUT of the flip-flop and the LUT programming is modified accordingly.

It should be appreciated that resynthesis at 207 need not involve re-synthesizing all of circuit design 201. Rather, only those candidate circuits obtained at 206 may be re-synthesized, namely incrementally re-synthesized using a prior synthesis for the remainder of the circuitry. Such resynthesis with respect to flip-flops and registers is described below in additional detail with respect to specific examples for purposes of clarity by way of example and not limitation.

After resynthesis at 207, analytical placement may be re-performed at 203 to determine if any control set overlapping still remains at 205. If there were still another control set overlap, then the loop would be run until no control set overlap exists.

There may be instances where one or more control set overlaps may not be resolved or alleviated by incremental resynthesis. For example if the control set overlap is due to different clock signals, then a sequential element in a bin will have to be moved to another bin to avoid the control set overlap as part of a re-placing.

Thus at 205, it may be determined whether any control set overlaps remaining are capable of being resolved by resynthesis. If there is no control set overlap remaining that would not be resolved by incremental resynthesis, then at 208 it may be determined whether there is any other re-placement to be performed to resolve such remaining one or more control set overlaps.

Continuing the above example, a flip-flop may be moved from one slice to a neighboring slice either having no other components placed therein or having another component, such as another sequential element having a same control set or a control set overlap which is subject to being alleviated by incremental resynthesis. Accordingly, any unresolved control set overlaps may be addressed at 208 by an incremental re-placement of a subset of sequential elements associated therewith.

Thus if there are any other re-placements to be performed at 208, such re-placements are made and then another analytical placement is performed at 203. Again, at 205, it may be determined whether any of the re-placements performed at 208 result in one or more control set overlaps capable of being resolved by incremental resynthesis. If such re-placement does result in any such control set overlap, then each such overlap may be resolved as previously described by incremental resynthesis.

Once there are no control set overlaps remaining as determined by there not being any incremental placements to be performed at 208, then at 209 one or more other synthesis optimizations, such as for combinatorial logic, may be performed. The ability to perform these optimizations may result from either or both incremental resynthesis performed at 207 or incremental re-placement performed at 208. One of such optimizations may be for reducing the number of control sets by applying forward retiming to candidate circuits obtained at 206. Forward retiming is a way of moving registers across a combinatorial boundary in a forward direction. So, for example, multiple flip-flops that are equivalent may be moved across logic as a new single register. Because forward retiming reduces the number of flip-flops, it may be used to alleviate a flip-flop packing problem as there are less flip-flop objects to pack and place.

After 209, flow 200 may output a netlist 211, where such netlist has enhanced bin packing density as compared to an interim netlist output from 202. For example, slice packing density may be increased due to incremental resynthesis by harmonizing control sets within bins as previously described.

Figure 3:
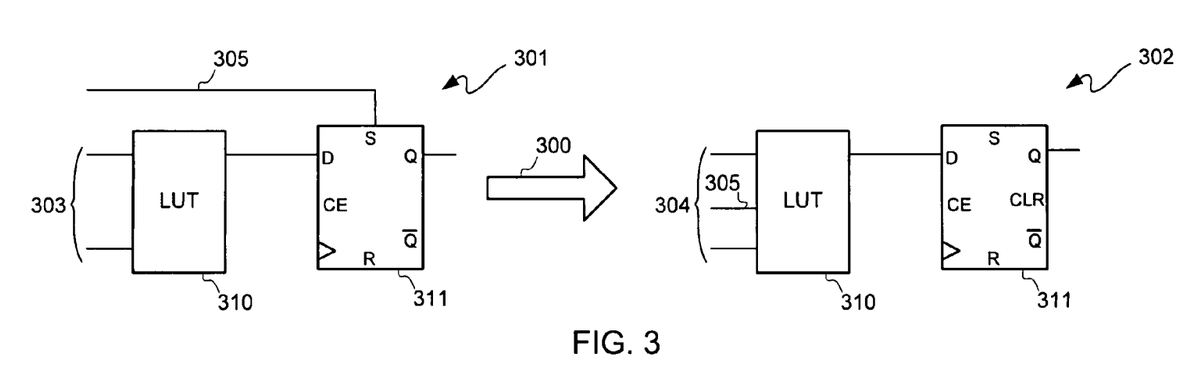
FIGS. 3 and 4 are block/circuit diagrams depicting respective alternative exemplary embodiments of an incremental resynthesis.

FIG. 3 is a block/circuit diagram depicting an exemplary embodiment of an incremental resynthesis, as generally indicated by arrow 300. Prior to resynthesis, circuit 301 includes LUT 310 and flip-flop 311, and after incremental resynthesis 300, circuit 301 is transformed into circuit 302 having LUT 310 and flip-flop 311. The difference is that in circuit 301, a set control signal 305 is provided to a set port of flip-flop 311. However, in re-synthesized circuit 302, set signal 305 is provided directly to LUT 310, and is not provided to flip-flop 311. Thus it should be appreciated that flip-flop 311 may be made to have the same control set as another flip-flop in the same bin, where such other flip-flop has no set signal provided to it. The absence of a control signal in a control set is described below in additional detail as a null or a null value in a field of a control set.

LUT 310 has to have enough available input pins for receiving an additional signal, namely set signal 305 in the example of circuit 302, due to an incremental resynthesis. Thus, inputs 303 to LUT 310 of circuit 301 become inputs 304 to LUT 310 of circuit 302, where set control signal 305 is added input to LUT 310.

Even though the example of a set control signal is used, it should be understood that an incremental resynthesis may be performed in like manner for a set signal, a reset signal, a clock enable signal, or a clear signal, or any combination thereof. As described below in additional detail, a hierarchal data structure, such as a tree diagram, may be used to determine which flip-flops may be incrementally re-synthesized.

Figure 4:
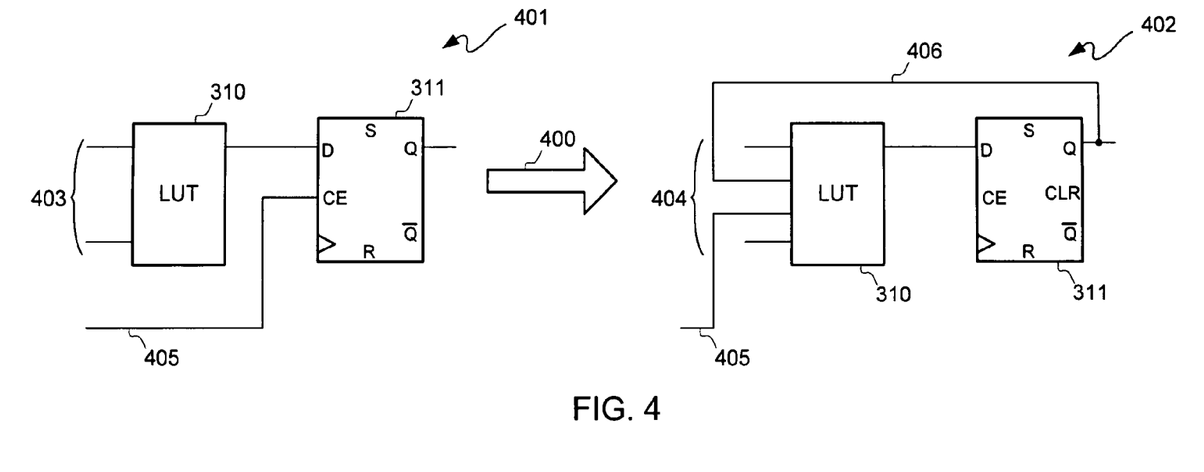

For resynthesis of a clock enable control signal, more is needed than in the example of FIG. 3. Accordingly, FIG. 4 is a block/circuit diagram depicting another exemplary embodiment of incremental resynthesis, as generally indicated by arrow 400. Prior to resynthesis 400, circuit 401 includes LUT 310 and flip-flop 311, and after resynthesis, circuit 401 is transformed in circuit 402 having LUT 310 and flip-flop 311. However, in circuit 401, clock enable signal 405 is directly provided to a clock enable port of flip-flop 311. However, in circuit 402, clock enable signal 405 is provided directly to LUT 310 for controlling operation of flip-flop 311. Additionally, output of flip-flop 311 is provided as a control feedback signal 406 as input to LUT 310. Again, LUT 310 may have one or more inputs 403 already allocated, and thus the expanded set of inputs 404 to LUT 310 in circuit 402 includes signals 405 and 406. Thus, it is determined whether LUT 310 would have a sufficient number of available input pins to accommodate the additional signals.

Even though block/circuit diagrams are depicted in FIGS. 3 and 4, it should be appreciated that for incremental resynthesis, actual circuits are not used, but rather program code, such as objects, representing such circuitry and signals are used. Accordingly, it should be appreciated that through incremental resynthesis, the number of control signals directly provided to a flip-flop may be reduced in order to harmonize flip-flops within a same slice. More generally, it should be appreciated that the number of control signals may be reduced as directly provided to a sequential element for harmonizing two or more sequential element within a same bin.

Figure 5:
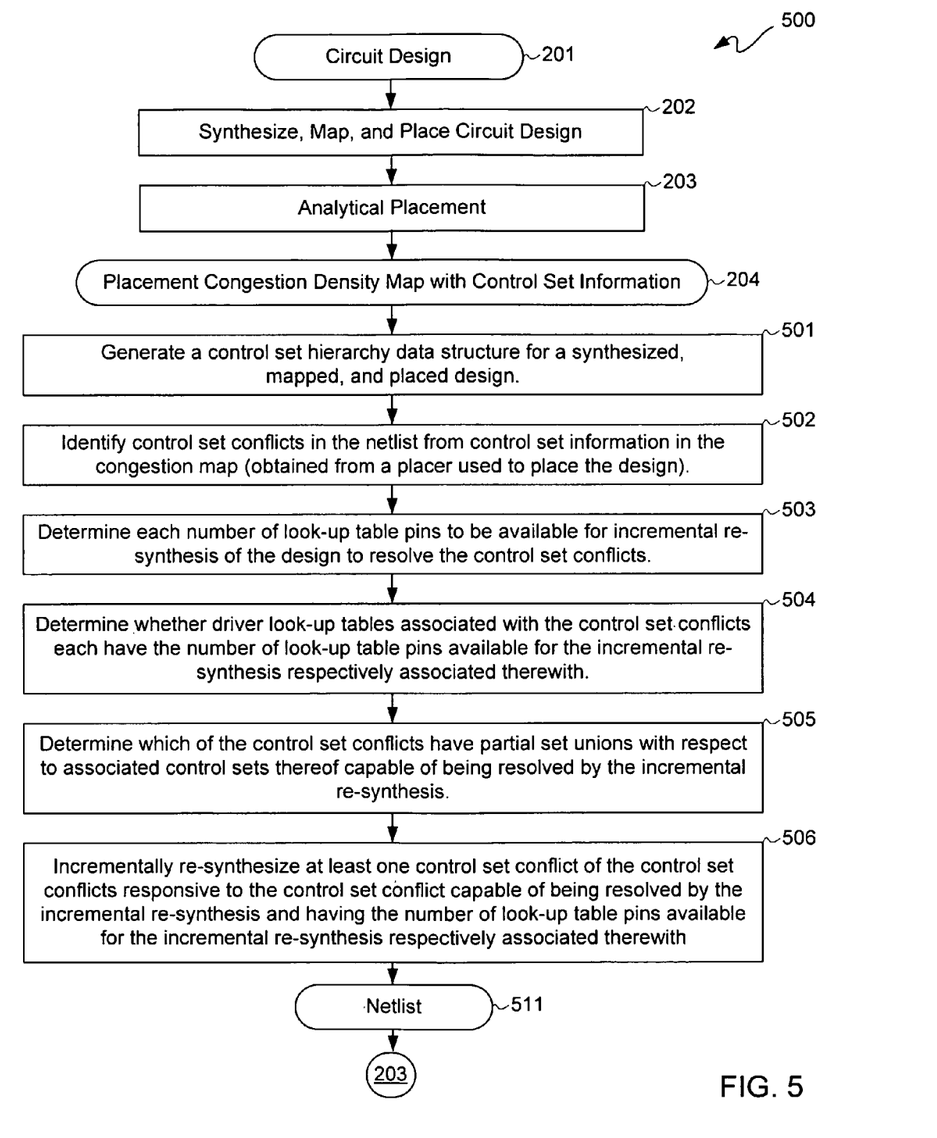
FIG. 5 is a flow diagram depicting an exemplary embodiment of a circuit placement flow.

FIG. 5 is a flow diagram depicting an exemplary embodiment of a circuit placement flow 500. A circuit design 201 is obtained and synthesized, mapped, and placed at 202. At 203 an analytical placement is performed as previously described with reference to FIG. 2. Output of analytical placement is a placement congestion density map having control set information 204. Operations 501 through 506 may be used for operations 205 through 207 of circuit placement flow 200 of FIG. 2, and are described in additional detail with reference to FIG. 4 for providing a netlist 511.

Figure 6:
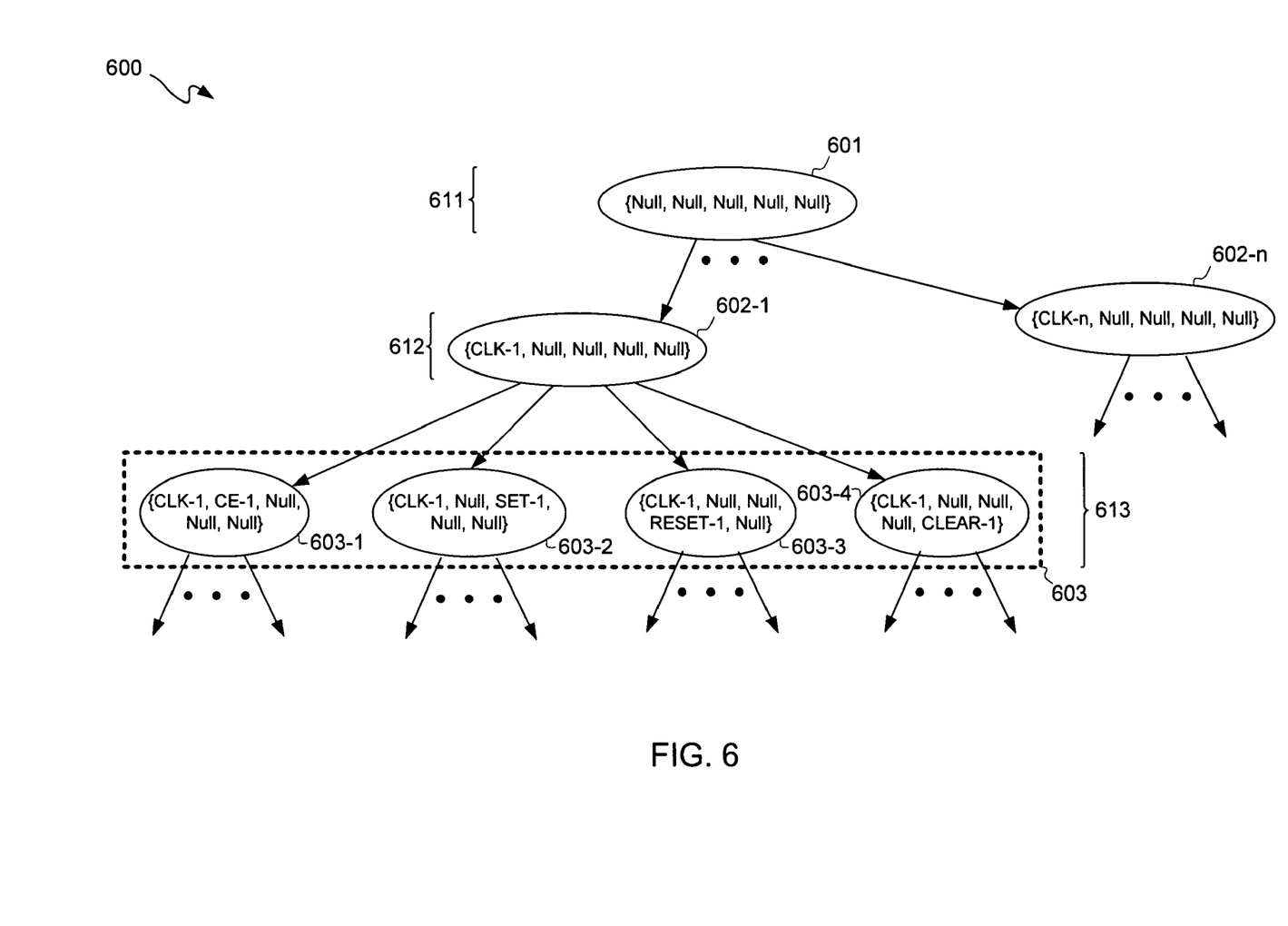
FIG. 6 is an exemplary embodiment of a data structure.

At 501, a control set hierarchical data structure is generated for a synthesized, mapped, and placed design. With reference to FIG. 6, there is shown an exemplary embodiment of a data structure 600. Data structure 600 in this exemplary embodiment is a tree structure; however it should be appreciated that other known types of data structures may be used. Node 601 is a parental node of sibling nodes 602-1 through 602-n. Node 602-1 is a parental node of sibling nodes 603-1 through 603-4.

Node 601 may be thought of as being at a parental node level 611, and likewise nodes 602-1 through 602-n may be thought of as being at a parental node level 612. Furthermore, nodes 603-1 through 603-4, provided they are not the very bottom nodes of tree diagram 600, may be thought of as being at a parental node level 613. It should be appreciated that adjacent parental node levels differ from one another in a single respect, namely a single control signal. Node 601 is a null control set, namely where there are no control signals provided. Null control set 601 would not apply to a sequential element having at least a clock signal provided thereto.

Nodes 602-1 through 602-n differ from node 601, in that a clock signal ("CLK"), namely clock signals are included as part each control set thereof. For example, node 602-1 includes clock-1 and node 602-n includes clock-n. The remainder of each control sets of nodes 602-1 through 602-n are null values, namely the fields or placeholders associated therewith are populated with null values. Accordingly, it should be appreciated that clock-1 through clock-n would be differing clock signals, for n some positive integer indicating the total number of clock signals represented in tree data structure 600.

Each sibling node within a same sibling set 603, namely directly descending from a same parental node, such as parental node 602-1 in this exemplary embodiment, differs from one another by one control signal, which is not a clock signal. Thus, for example, nodes 603-1 through 603-4 all inherit clock-1 from parental node 602-1. However, node 603-1 through 603-4 are otherwise different from one another with respect to one control signal. For example, node 603-1 has a clock enable ("CE-1") control signal and the remainder of the control signals of the control set of such node are null values, and node 603-2 has a set-1 control signal and the remainder of the control signals, other than the clock signal, for node 603-2 are null values. Thus, nodes 603-1 and 603-2 differ by one control signal. Likewise, node 603-3 has a reset-1 control signal and the remainder of such control signals, other than clock-1, are null values for that control set, and node 603-4 has a clear-1 control signal, and the remainder of the control signals of that control set, other than clock-1, are null values.

Thus, flip-flops that have no control signals other than a clock signal would be placed in nodes of parental level 612 according to their clock signal. For example, all flip-flops with a clock-1 clock signal input and having no other control signals would be associated with node 602-1, thus there would be no reason to harmonize any of such flip-flops associated with a same node 602-1. Likewise, all flip-flops with a clock-1 and clock enable-1 control signal, and having no other control signals in their control set would be associated with node 603-1. Accordingly, flip-flops may be associated with nodes representing the control sets of such flip-flops, respectively.

Flip-flops associated with different nodes within a same sibling set 613 may be capable of being harmonized. For example, a flip-flop associated with node 603-1 may be harmonized with a flip-flop associated with node 603-2, even though nodes 603-1 and 603-2 have different control signals, namely CE-1 and set-1. For example, if such flip-flops have their control sets incrementally re-synthesized to remove such control signals from the flip-flops to associated driving LUTs, then such control sets may be harmonized by moving them up a level such as to node 602-1 of parental level 612. For example, suppose a first flip-flop is associated with node 603-1 and a second flip-flop is associated with node 603-2. As previously described with reference to FIGS. 3 and 4, the clock enable and set control signals respectively provided to such flip-flops may be moved to LUTs provided pins are available for same. Thus, such associated LUTs may be used to drive such flip-flops and receive the control signals therefor, other than clock signal-1 in this example. After incremental resynthesis, the control sets for such first and second flip-flops would have a clock-1 value and the remainder would be null values, namely the control set of node 602-1. Thus such flip-flops after incremental resynthesis may be moved up for association with node 602-1. Accordingly, it should be appreciated that nodes of data structure 600 may have different circuit objects associated therewith after incremental resynthesis for purposes of enhancing density of such components within bins.

Returning to FIG. 5, after generating the control set hierarchy data structure at 501, control set conflicts in an interim netlist may be identified at 502 from control set information in congestion density map 204. Once again, control set information obtained from congestion density map 204 may be used for generating tree data structure 600 as well as for associating sequential elements with nodes thereof.

At 503, it is determined whether there are sufficient LUT pins available for incremental resynthesis to resolve control set conflicts. Accordingly, this is done on a LUT-by-LUT basis with respect to sequential elements associated therewith having control set conflicts.

At 504, it is determined whether driver LUTs associated with control set conflicts each have a sufficient number of LUT pins available for incremental resynthesis respectively associated therewith. Thus at 503, total numbers of available input pins for each of the LUTs associated with control set conflicts may be determined, and at 504, it may be determined whether such number of pins is sufficient for each targeted incremental resynthesis.

At 505, it is determined which of the control set conflicts have partial set unions with respect to associated control sets thereof capable of being re-synthesized for resolution of such conflicts, where the number of available pins of driving LUTs are sufficient for such re-syntheses. Again, with reference to FIG. 6, "partial set union" means that nodes are in a same sibling set.

At 506, at least one control set conflict of the control set conflicts is incrementally re-synthesized responsive to the control set conflict capable of being resolved by the incremental resynthesis and having the number of LUT pins available for such incremental resynthesis respectively associated therewith for outputting netlist 511. Netlist 511 may be output for subsequent analytical placement 203 as previously described.

Figure 7A:
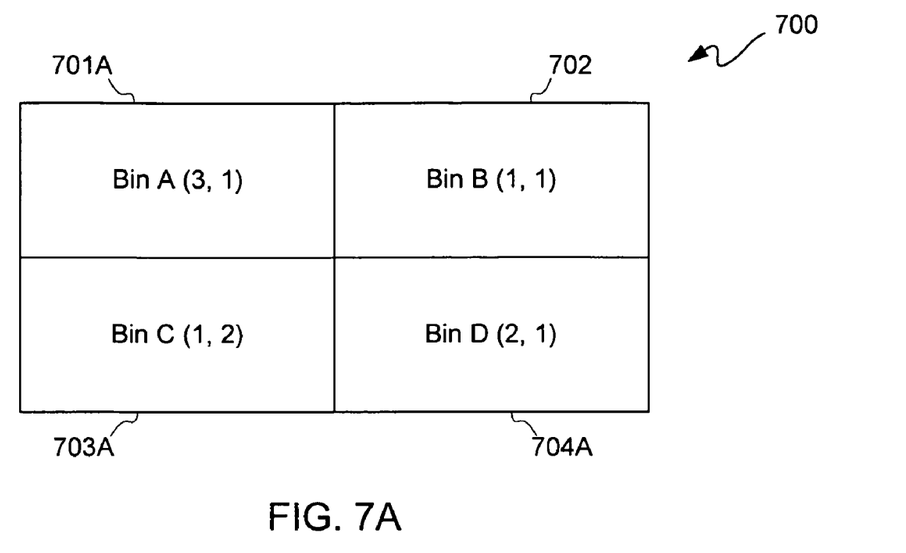
FIGS. 7A and 7B are block diagrams depicting respective alternative exemplary embodiments of bins.
Figure 7B:
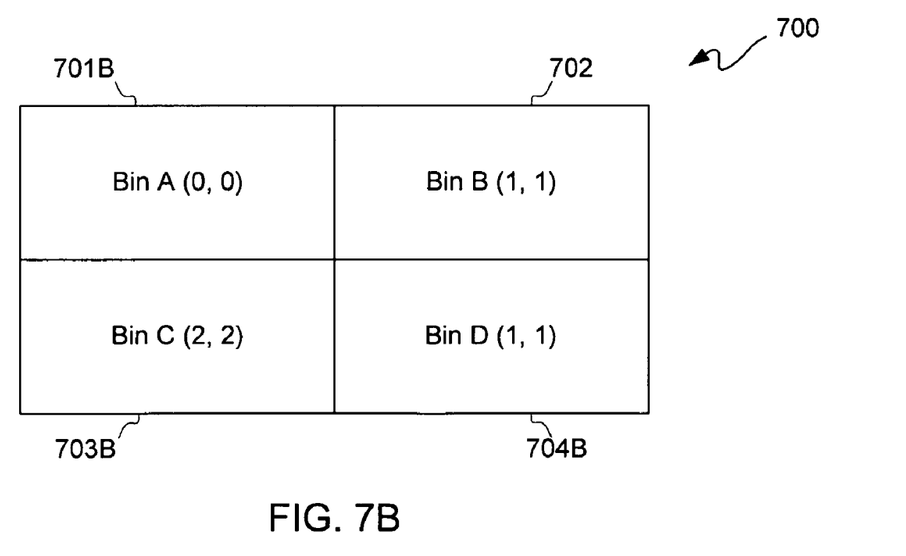

For purposes of clarity by way of example and not limitation, FIGS. 7A and 7B are block diagrams depicting respective alternative exemplary embodiments of overlapped bins 700. For each analytical placement operation, an iterative loop for solving a conjugate gradient forcing computation in spreading may be used. The analytical placement spreading and solving with revised forces uses a physical overlap as a threshold for exiting. For example, if physical overlap is equal to or less than 20%, then legalization, namely fitting, may be performed. Before fitting, it is determined whether to re-synthesize to alleviate control set contention for a design. If resynthesis is to be performed, then for example blocks are fit into a "legal" slot, namely a slot proximal to where an analytical placement solution for such block arrived at with overlaps. Thus, if there is a control set conflict, incremental resynthesis is performed on components associated with the control set conflict. If there is no control set conflict remaining, a conventional fitting or an incremental placement flow may be used after incremental resynthesis.

The threshold for overlap may be varied from application to application. In other words, such a value may be defined as a tunable parameter which indicates a control set optimization for a particular application, and it should be appreciated that for such applications such control set overlap threshold may be triggered. If a control set overlap threshold is not met, indicating that there is not a significant or any problem, then analytical placement may be considered completed and optimizers, such as at 209, may be run.

Once candidate circuits for resynthesis are obtained, such as at 206 of FIG. 2, from overlapped bins 700, sequential elements, such as flip-flops, may be selected for resynthesis. Again, as indicated in FIG. 6, because control set resynthesis is not applicable to different clock signals, sequential elements may be categorized by clock signals. For purposes of clarity by way example and not limitation, suppose there are control sets, namely control sets 1, 2, and 3, where such control sets all have the same clock signals but differ with respect to control signals.

In FIG. 7A, after analytical placement and associated binning, bin A 701A includes control sets (3, 1), bin B 702 includes control sets (1, 1), bin C 703A includes control sets (1, 2), and bin D 704A includes control sets (2, 1). Accordingly, presently there is no conflict in bin B 702 as all control sets within such bin are the same. Because control set conflicts are a packing and fitting issue with respect to placement, bins A, C, and D of FIG. 7A have control set overlaps or conflicts which are not correctly fitting. If it is possible to re-place or swap sequential elements from bin C and D, namely swap control set 2 for control set 1 with respect to bins C 703A and D 704A, then those bins may be made fitting without having to do incremental resynthesis. Such swap is illustratively shown in FIG. 7B, where bin C 703B now has control sets (2, 2), and bin D 704B now has control sets (1, 1).

However, bin A 701A of FIG. 7A has a control set overlap which is not capable of being resolved by swapping sequential elements between bins, and thus such control set overlap is a candidate for incremental resynthesis. If two sequential elements belong to control sets 3 and 1, respectively, of bin A, and resynthesis is performed on one or more of such flip-flops, then a new control set may be created with both of such flip-flops in bin A 701B belonging to such control set. For purposes of clarity by way of example and not limitation, such new control set is labeled 0, and this transformation is illustratively shown in FIG. 7B, where bin A 701B has control sets (0, 0).

Thus, returning to FIG. 2, it should be appreciated that at 205 not all circuits having control set overlaps are candidates for resynthesis, namely there may be some control set overlaps which may be resolved by refitting or re-placing in other bins. Such control set overlaps may be handled by analytical placement at 203.

Figure 8:
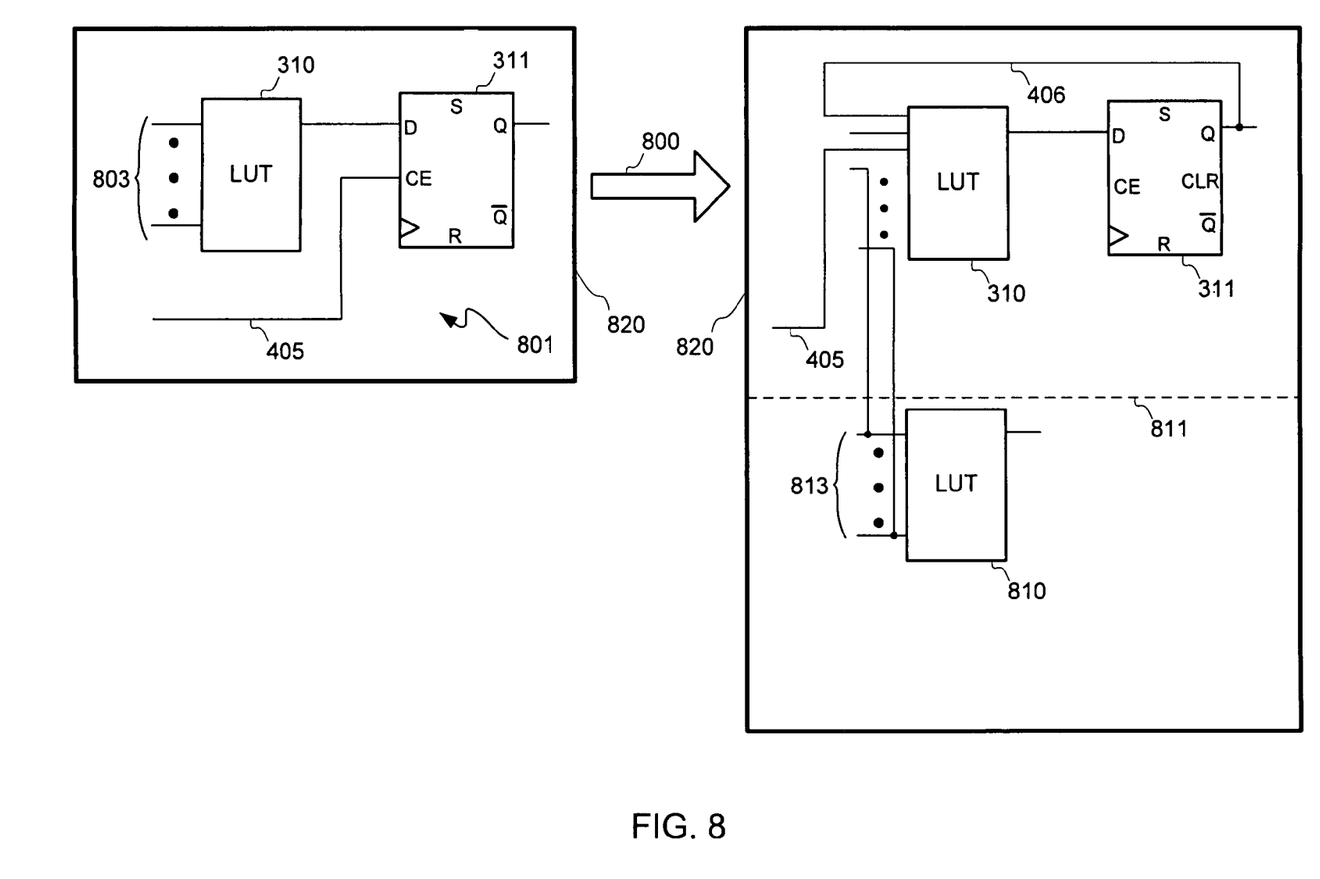
FIG. 8 is a block/circuit diagram depicting an exemplary embodiment of an incremental resynthesis.

FIG. 8 is a block/circuit diagram depicting an exemplary embodiment of an incremental resynthesis as generally indicated by arrow 800. Circuit 801 in bin 820 includes LUT 310 and flip-flop 311. Flip-flop 311 receives a clock enable control signal 405, and LUT 310 has no or not enough available pins owing to inputs 803 taking up pins of LUT 310. After incremental resynthesis 800, another LUT 810, which may or may not be in the same bin 820 as generally indicated by dashed line 811, may be used to copy LUT 310 with a portion 813 of inputs 803, where such portion 813 is some or all of inputs 803 except those for flip-flop 311. Such portion 813 may be only enough as to make enough pins available for incremental resynthesis.

As previously described with respect to FIG. 4, clock enable control signal 405 is then routed to an available pin of LUT 310, and feedback control signal 406 from flip-flop 311 is fed back as an input to LUT 310.

Figure 9:
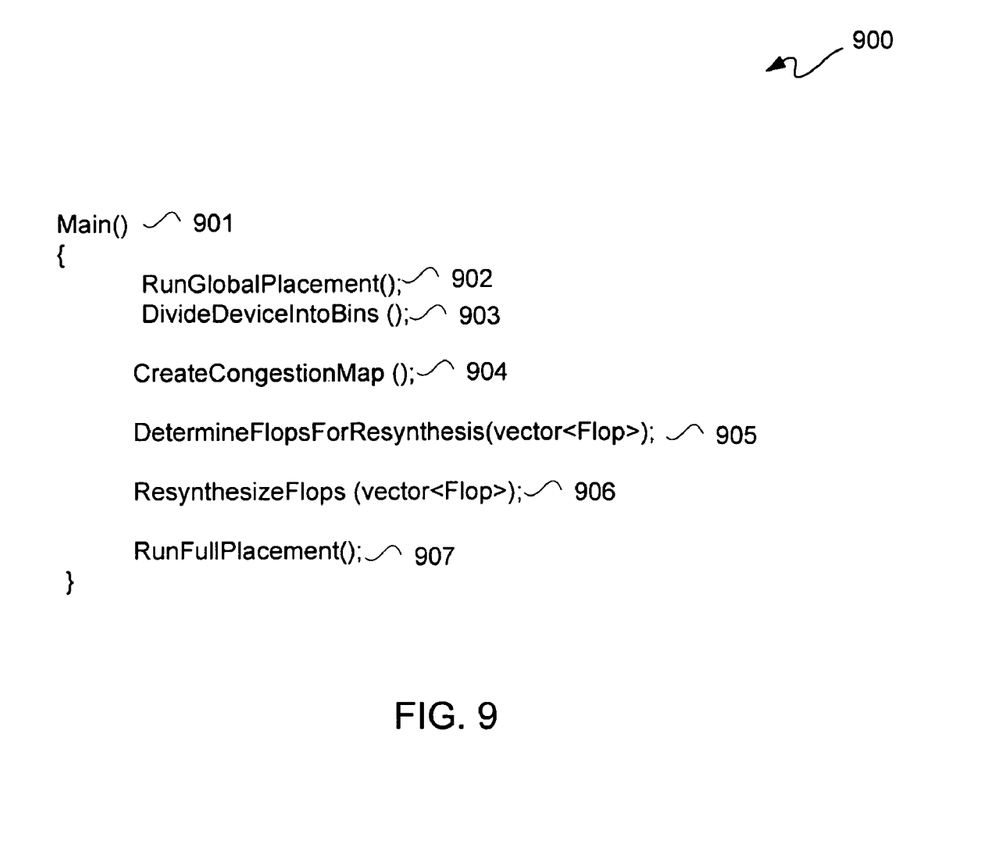
FIG. 9 is a pseudocode listing depicting an exemplary embodiment of a place and re-synthesize flow.

FIG. 9 is a pseudocode listing depicting an exemplary embodiment of a place and re-synthesize flow 900. At 901, a main routine is initiated. At 902, a global placement is performed. The global placement causes execution of an analytical placement where the result has a low overlap.

At 903, the FPGA is divided up into an m-by-n window of CLBs 102, where m and n are positive integers that may or may not be equal to one another. For purposes of clarity by way of example and not limitation, it shall be assumed that a Virtex5™ FPGA from Xilinx, Inc. is implemented; however, it should be understood that other known integrated circuit devices having an array of programmable logic blocks having field programmable logic gates may be used. For a Virtex5™ FPGA from Xilinx, each slice may have four flip-flops of a same control set therein.

At 904, a congestion map may be generated. Flip-flops may be categorized based on their control sets to determine how many slices may be used to fit all of such flip-flops. This number of slices is the "demand." There is a finite "supply" of slices available in a bin, and that slices may be placed into bins according to their control set. If the demand exceeds the supply, then there is a positive overflow. A positive overflow means a bin, such as a bin of slices, is congested, namely has an overlap.

There may be multiple congested bins of slices. Flip-flops in congested bins are considered for resynthesis at 905. Thus, from congested bins, flip-flops to be re-synthesized may be selected. The vector of a flip-flop may be used to select it for resynthesis.

At 906, flip-flops selected at 905 may be re-synthesized. Again, a vector for each flip-flop may be used to identify each such flip-flop to be re-synthesized. At 907, a full placement may be performed. Such a full placement executes a detailed placement for a circuit design.

Accordingly, it should be understood that control resynthesis without placement information might lead to an inaccurate optimization. In other words, without knowing where there is placement congestion and hence fitting issues, control resynthesis might lead to an inaccurate optimization. However, executing a global placement at 902 and then subsequently performing resynthesis at 906 as previously described, facilitates operating on more accurate information. Hence, a accuracy in optimization is enhanced, namely a placement driven control set resynthesis is more likely to result in accurate optimization.

Figure 10:
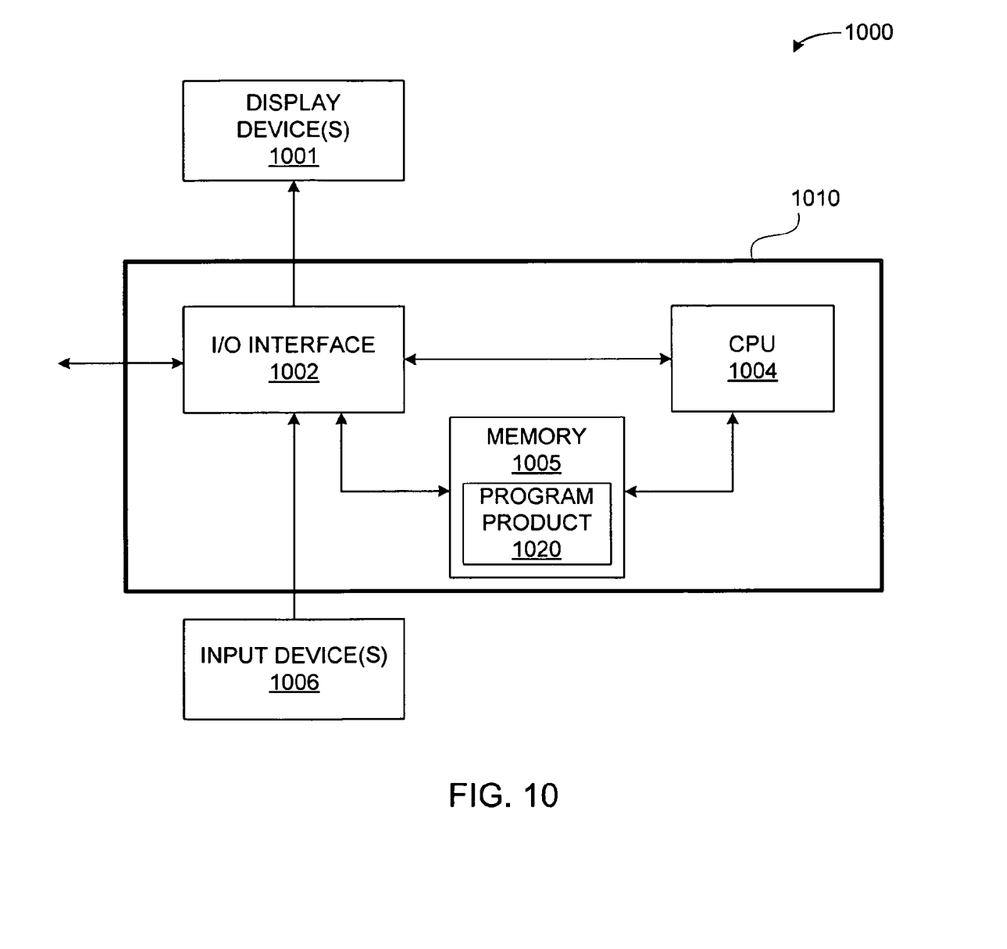
FIG. 10 is a high-level block diagram of an exemplary embodiment of a computer system.

FIG. 10 is a high-level block diagram of an exemplary embodiment of a computer system 1000. Computer system 1000 may include a programmed computer 1010 coupled to one or more display devices 1001, such as Cathode Ray Tube ("CRT") displays, Plasma displays, Liquid Crystal Displays ("LCD"), and to one or more input devices 1006, such as a keyboard and a cursor pointing device. Other known configurations of a computer system may be used.

Programmed computer 1010 may be programmed with a known operating system, which may be Mac OS, Java Virtual Machine, Linux, Solaris, Unix, or a Windows operating system, among other known platforms. Programmed computer 1001 includes a central processing unit (CPU) 1004, memory 1005, and an input/output ("I/O") interface 1002. CPU 1004 may be a type of microprocessor known in the art, such as available from IBM, Intel, and Advanced Micro Devices for example. Support circuits (not shown) may include conventional cache, power supplies, clock circuits, data registers, and the like. Memory 1005 may be directly coupled to CPU 1004 or coupled through I/O interface 1002. At least a portion of an operating system may be disposed in memory 1005. Memory 1005 may include one or more of the following: random access memory, read only memory, magneto-resistive read/write memory, optical read/write memory, cache memory, magnetic read/write memory, and the like, as well as signal-bearing media as described below.

I/O interface 1002 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 1002 may be coupled to a conventional keyboard, network, mouse, display printer, and interface circuitry adapted to receive and transmit data, such as data files and the like. Notably, programmed computer 1010 may be coupled to a number of client computers, server computers, or any combination thereof via a conventional network infrastructure, such as a company's Intranet and/or the Internet, for example, allowing distributed use for interface generation.

Memory 1005 may store all or portions of one or more programs or data to implement processes in accordance with one or more aspects of the invention to provide flow 200 as program product 1020. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product 1020, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for circuit placement in an integrated circuit device, comprising:
    synthesizing and mapping a design;
    placing, by a computer, components of the design to provide a first placed design;
    generating a congestion density map for the first placed design;
    identifying a congestion region in the congestion density map;
    targeting the congestion region for determining if the first placed design has a control set conflict;
    selecting a first circuit object associated with the control set conflict; and
    either re-placing or re-synthesizing the first circuit object to at least diminish the control set conflict,
    wherein the control set conflict is between the first circuit object and a second circuit object located in a same first block object, and wherein the control set conflict includes when the first circuit object and the second circuit object have different control sets.

2. The method according to claim 1, wherein the first block object represents a portion of a field programmable gate array.

3. The method according to claim 2, wherein the portion of the field programmable gate array is a slice of a Programmable Logic Device.

4. The method according to claim 2, wherein the re-placing includes relocating the first circuit object to a second block object at least in close proximity to the first block object with respect to locations in the field programmable gate array.

5. The method according to claim 4, wherein the second block object is not occupied by a third circuit object.

6. The method according to claim 4, wherein the second block object is occupied by a third circuit object; and wherein the first circuit object and the third circuit object have a same control set.

7. The method according to claim 2, wherein the first circuit object is associated with a flip-flop object; wherein the re-synthesizing includes incorporating a portion of a control set of the flip-flop object in a first look-up table object, the flip-flop object and the first look-up table object both being associated with the portion of the field programmable gate array; and wherein the portion of the control set does not include a clock signal associated with the first circuit object.

8. The method according to claim 7, wherein the re-synthesizing includes replacing the first look-up table object with a second look-up table object, the second look-up table object being a copy of the first look-up table object prior to incorporation of the portion of the control set of the first flip-flop object, and wherein the second look-up table object is located in another portion of the field programmable gate array.

9. The method according to claim 2, wherein the re-placing and the re-synthesizing are each incremental so as to avoid the re-placing and the re-synthesizing of the entire design.

10. A non-transitory computer-readable medium having instructions which when executed on a computer perform a method comprising:
    synthesizing and mapping a design;
    placing components of the design to provide a first placed design;
    generating a congestion density map for the first placed design;
    identifying a congestion region in the congestion density map;
    targeting the congestion region for determining if the first placed design has a control set conflict;
    selecting a first circuit object associated with the control set conflict; and
    either re-placing or re-synthesizing the first circuit object to at least diminish the control set conflict,
    wherein the control set conflict is between the first circuit object and a second circuit object located in a same first block object, and wherein the control set conflict includes when the first circuit object and the second circuit object have different control sets.

11. The medium of claim 10, wherein the first block object represents a portion of a field programmable gate array.

12. The medium of claim 11, wherein the portion of the field programmable gate array is a slice of a Programmable Logic Device.

13. The medium of claim 11, wherein the re-placing includes relocating the first circuit object to a second block object at least in close proximity to the first block object with respect to locations in the field programmable gate array.

14. The medium of claim 13, wherein the second block object is not occupied by a third circuit object.

15. The medium of claim 13, wherein the second block object is occupied by a third circuit object; and wherein the first circuit object and the third circuit object have a same control set.

16. The medium of claim 11, wherein the first circuit object is associated with a flip-flop object; wherein the re-synthesizing includes incorporating a portion of a control set of the flip-flop object in a first look-up table object, the flip-flop object and the first look-up table object both being associated with the portion of the field programmable gate array; and wherein the portion of the control set does not include a clock signal associated with the first circuit object.

17. The medium of claim 16, wherein the re-synthesizing includes replacing the first look-up table object with a second look-up table object, the second look-up table object being a copy of the first look-up table object prior to incorporation of the portion of the control set of the first flip-flop object, and wherein the second look-up table object is located in another portion of the field programmable gate array.

18. The medium of claim 11, wherein the re-placing and the re-synthesizing are each incremental so as to avoid the re-placing and the re-synthesizing of the entire design.

* * * * *